United States Patent
Chen et al.

(10) Patent No.: US 10,709,033 B2
(45) Date of Patent: Jul. 7, 2020

(54) COUPLING ASSEMBLY AND CABLE MANAGEMENT DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chiang-Hsueh Fang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/231,782

(22) Filed: Dec. 24, 2018

(65) Prior Publication Data
US 2020/0060040 A1 Feb. 20, 2020

(30) Foreign Application Priority Data
Aug. 20, 2018 (TW) .............................. 107129219 A

(51) Int. Cl.
| | | |
|---|---|---|
| F16M 11/00 | (2006.01) | |
| H05K 7/14 | (2006.01) | |
| H02G 11/00 | (2006.01) | |
| H05K 7/18 | (2006.01) | |

(52) U.S. Cl.
CPC ........... *H05K 7/1491* (2013.01); *H02G 11/00* (2013.01); *H05K 7/183* (2013.01)

(58) Field of Classification Search
CPC .......... H02G 3/00; H02G 3/32; H05K 7/1491; H05K 7/183
See application file for complete search history.

(56) References Cited

U.S. PATENT DOCUMENTS

| | | | |
|---|---|---|---|
| 6,715,718 B1 | 4/2004 | Chen et al. | |
| 9,281,676 B2 | 3/2016 | Chen et al. | |
| 9,635,942 B2 | 5/2017 | Chen et al. | |
| 2006/0113433 A1* | 6/2006 | Chen ..................... | H05K 7/1491 248/70 |
| 2014/0183306 A1* | 7/2014 | Chen .................... | H05K 7/1491 248/70 |
| 2016/0186895 A1* | 6/2016 | Chen ....................... | F16L 3/015 248/68.1 |
| 2016/0330859 A1* | 11/2016 | Chen .................... | H05K 7/1491 |
| 2018/0049341 A1* | 2/2018 | Chen ....................... | H02G 3/32 |

(Continued)

*Primary Examiner* — Amy J. Sterling
(74) *Attorney, Agent, or Firm* — Rosenberg, Klein & Lee

(57) ABSTRACT

The cable management device of a coupling assembly includes a first cable management arm, a second cable management arm, a first component, and a second component. The second cable management arm can be moved with respect to the first cable management arm. The first component is pivotally connected with respect to the first cable management arm. The second component can be displaced to either one of a first position and a second position with respect to the first component. The second component and the first component define a first length when the second component is at the first position. The second component and the first component define a second length different from the first length when the second component is at the second position.

18 Claims, 7 Drawing Sheets

(56) References Cited

U.S. PATENT DOCUMENTS

2019/0150314 A1* 5/2019 Chen .................. H05K 7/183
                                                      361/727
2019/0319441 A1* 10/2019 Chen .................. H02G 3/32

* cited by examiner

COUPLING ASSEMBLY AND CABLE MANAGEMENT DEVICE THEREOF

FIELD OF THE INVENTION

The present invention relates to a cable management device and more particularly to a cable management device for use with slide rails.

BACKGROUND OF THE INVENTION

Generally, an electronic equipment rack system is so designed that a piece of electronic equipment is mounted on a rack via a pair of slide rail assemblies in order to be able to be pulled out of and pushed back into the rack through the slide rails of the slide rail assemblies. As electronic equipment has cables, a cable management device may be required to support those cables or put them in order.

U.S. Pat. No. 6,715,718 B1, for example, discloses an adjustable bracket device connected between a cable management arm and a rack. As shown in FIG. 5 accompanying the specification of this US patent, a cable management arm (30) of a predetermined length can be applied to a rack (10) of a relatively small depth by being attached to a chassis (20) and an adjustable bracket (40) via a positioning plate (51) and a fixing member (52), or more particularly by being selectively positioned at a rear position (a) of the adjustable bracket (40). The cable management arm (30) can also be applied to a rack (10') of a relatively great depth by being selectively positioned at a front position (b) of the adjustable bracket (40).

The adjustable bracket (40), therefore, allows the cable management arm (30) to be applied to racks of different depths. As another example, U.S. Pat. No. 9,281,676 B2 discloses an adjustment device for a cable management arm, wherein the cable management arm (20) is connected to two posts (22, 24) of a rack via two adjustment devices (16, 18) respectively. The two adjustment devices (16, 18) are adjustable in length to adapt the cable management arm (20) to racks of different depths. The disclosures of the afore-cited patents are incorporated herein by reference.

SUMMARY OF THE INVENTION

The present invention relates to the cable management device of a coupling assembly, wherein the cable management device has a variable coupling length.

According to one aspect of the present invention, a coupling assembly includes a slide rail assembly and a cable management device. The slide rail assembly includes a first rail and a second rail, wherein the second rail can be displaced with respect to the first rail. The cable management device includes a first cable management arm, a second cable management arm, a first component, a second component, and a first engaging member. The second cable management arm is pivotally connected with respect to the first cable management arm. The first component is pivotally connected with respect to the first cable management arm. The second component can be displaced with respect to the first component. The first engaging member is disposed on one of the first component and the second component and is configured to engage with the other of the first component and the second component so as to keep the second component at one of a plurality of different positions with respect to the first component.

Preferably, the first component includes a first guiding feature, and the second component is provided with a first projection. The first projection is located in a portion of the first guiding feature so that the second component can be displaced with respect to the first component to a limited extent.

Preferably, the first guiding feature is a slot or an elongated groove.

Preferably, the first component and the second component are mounted with respect to each other via a channel Preferably, the first engaging member is disposed on the first component and includes a first elastic arm and a first engaging portion, wherein the first engaging portion is disposed on the first elastic arm and is configured to engage with either one of a first feature and a second feature of the second component.

Preferably, the cable management device includes a first coupling member, wherein the first coupling member is pivotally connected with respect to the second component and is configured to mount the cable management device on the first rail.

Preferably, the cable management device includes a third component, a fourth component, and a second engaging member. The third component is pivotally connected with respect to the second cable management arm. The fourth component can be displaced with respect to the third component. The second engaging member is disposed on one of the third component and the fourth component and is configured to engage with the other of the third component and the fourth component so as to keep the fourth component at one of a plurality of different positions with respect to the third component.

Preferably, the third component includes a second guiding feature, and the fourth component is provided with a second projection. The second projection is located in a portion of the second guiding feature so that the fourth component can be displaced with respect to the third component to a limited extent.

Preferably, the second guiding feature is a slot or an elongated groove.

Preferably, the third component and the fourth component are mounted with respect to each other via a channel Preferably, the second engaging member is disposed on the third component and includes a second elastic arm and a second engaging portion, wherein the second engaging portion is disposed on the second elastic arm and is configured to engage with either one of a first feature and a second feature of the fourth component.

Preferably, the cable management device includes a second coupling member, wherein the second coupling member is pivotally connected with respect to the fourth component and is configured to mount the cable management device on the second rail.

Preferably, the cable management device includes a supporting member, a mounting base, and a third coupling member. The supporting member is configured to support one of the first cable management arm and the second cable management aim. The mounting base is disposed on the supporting member. The third coupling member can be displaced with respect to the mounting base.

Preferably, the mounting base includes a third guiding feature, and the third coupling member is provided with a third projection. The third projection is located in a portion of the third guiding feature so that the third coupling member can be displaced with respect to the mounting base to a limited extent.

Preferably, the coupling assembly includes another slide rail assembly, which includes a third rail and a fourth rail.

The fourth rail can be displaced with respect to the third rail, and the third coupling member is configured to be coupled to the third rail.

According to another aspect of the present invention, a cable management device includes a first cable management aim, a second cable management aim, a first component, and a second component. The second cable management aim can be moved with respect to the first cable management aim. The first component is pivotally connected with respect to the first cable management arm. The second component can be displaced to either one of a first position and a second position with respect to the first component. When the second component is at the first position with respect to the first component, the second component and the first component define a first length. When the second component is at the second position with respect to the first component, the second component and the first component define a second length, which is different from the first length.

DETAILED DESCRIPTION OF THE INVENTION

Figure 1:
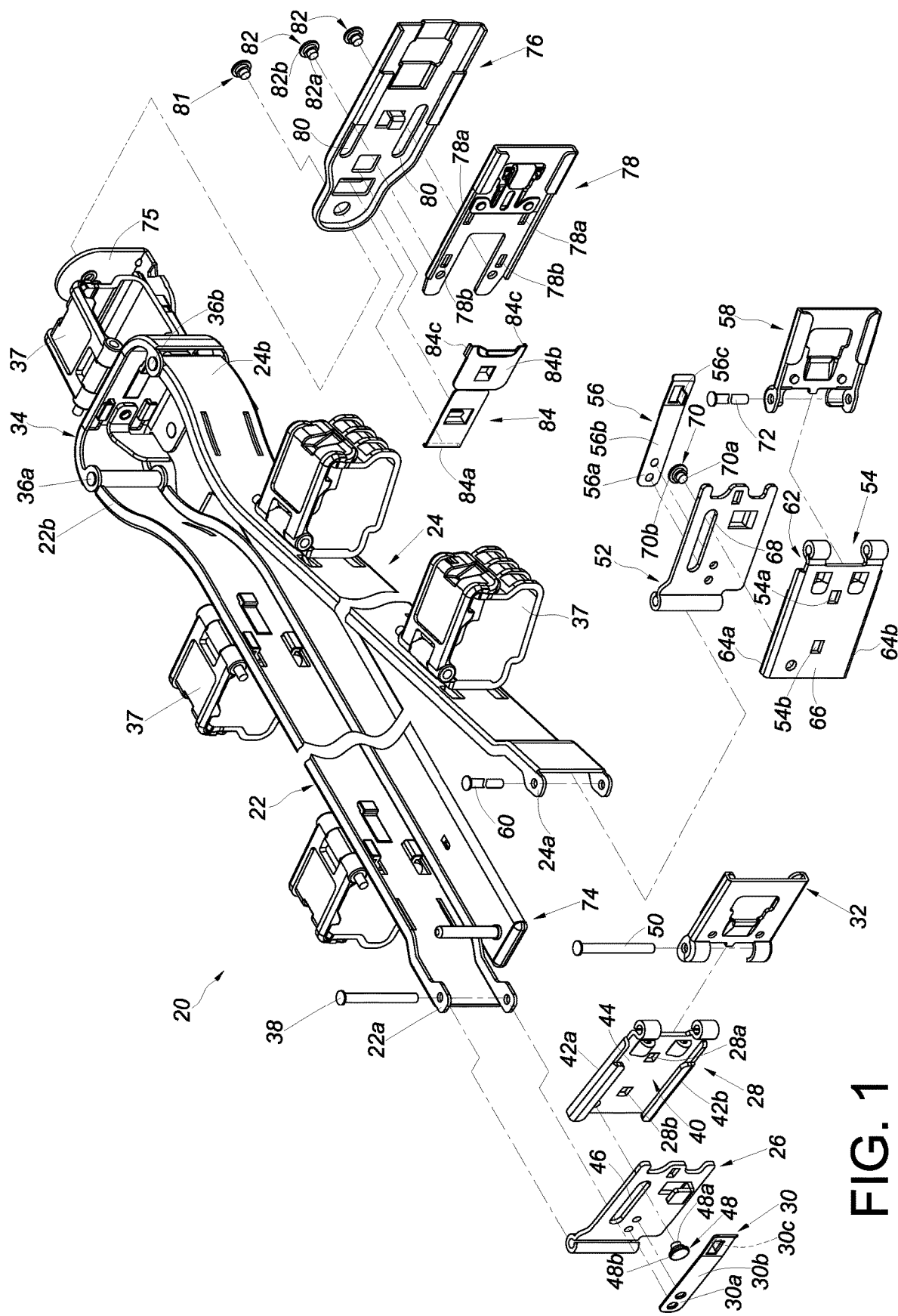
FIG. 1 is an exploded perspective view of the cable management device according to an embodiment of the present invention.
Figure 2:
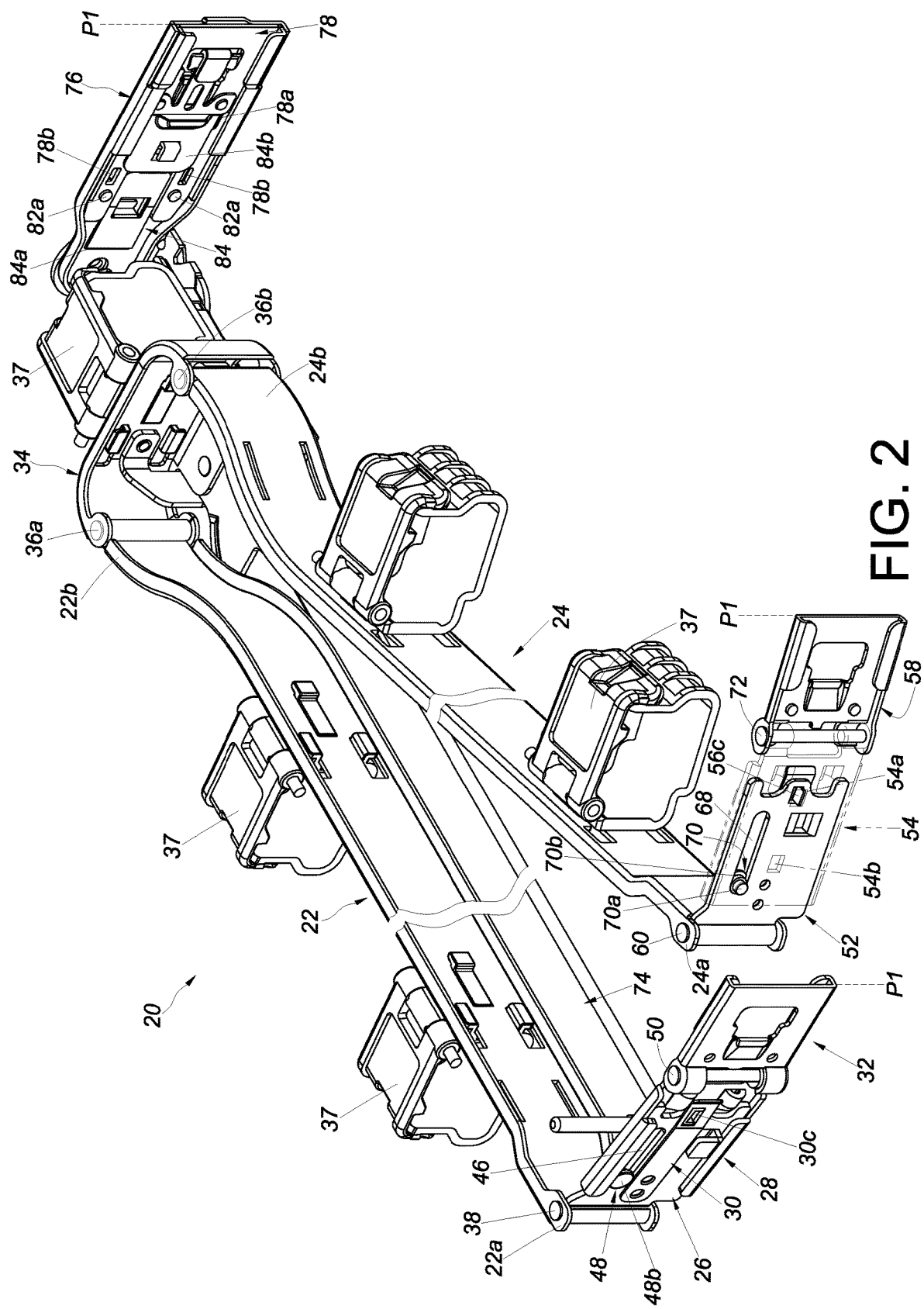
FIG. 2 is an assembled perspective view of the cable management device according to the embodiment of the present invention.

Referring to FIG. 1 and FIG. 2, the cable management device 20 according to an embodiment of the present invention includes a first cable management arm 22, a second cable management arm 24, a first component 26, and a second component 28. Preferably, the cable management device 20 further includes a first engaging member 30 and a first coupling member 32.

The first cable management arm 22 includes a first end portion 22a and a second end portion 22b away from the first end portion 22a.

The second cable management arm 24 can be moved with respect to the first cable management arm 22. The second cable management arm 24 includes a first end portion 24a and a second end portion 24b away from the first end portion 24a. More specifically, the second cable management arm 24 is pivotally connected with respect to the first cable management arm 22. For example, the second cable management arm 24 is pivotally connected to the first cable management arm 22 at a position adjacent to the second end portion 22b of the first cable management arm 22. More specifically, the second end portion 24b of the second cable management arm 24 and the second end portion 22b of the first cable management arm 22 are pivotally connected with respect to each other. Here, by way of example, a pivotal connection base 34 is pivotally connected to the second end portion 22b of the first cable management arm 22 and the second end portion 24b of the second cable management arm 24 via two shafts 36a, 36b respectively. Preferably, one of the first cable management arm 22, the second cable management arm 24, and the pivotal connection base 34 is provided with a cable accommodating feature 37. Here, each of the first cable management arm 22, the second cable management arm 24, and the pivotal connection base 34 is provided with at least one cable accommodating feature 37 by way of example.

The first component 26 is pivotally connected with respect to the first cable management arm 22, wherein the pivotal connection may be formed either directly or indirectly. Here, the first component 26 is pivotally connected to the first cable management arm 22 at a position adjacent to the first end portion 22a of the first cable management arm 22 via a first pivotal connection element 38 by way of example but not limitation.

The second component 28 can be displaced with respect to the first component 26. Preferably, the second component 28 and the first component 26 are movably mounted with respect to each other through a channel 40. Here, by way of example, the second component 28 includes a first wall 42a, a second wall 42b, and a middle wall 44 connected between the first wall 42a and the second wall 42b; and the first wall 42a, the second wall 42b, and the middle wall 44 of the second component 28 jointly define the channel 40 for accommodating the first component 26. Preferably, the first component 26 includes a first guiding feature 46, and the second component 28 is additionally equipped, or integrally formed, with a first projection 48. The first projection 48 is located in a portion of the first guiding feature 46 so that the second component 28 can be displaced with respect to the first component 26 to a limited extent. In this embodiment, the first guiding feature 46 is a slot or elongated groove with a boundary, and the first projection 48 has a body 48a and a head 48b. The body 48a extends through a portion of the first guiding feature 46 and is connected to the second component 28. The head 48b is larger than the body 48a and is stopped on one side of the first component 26. In practice, however, the first guiding feature 46 and the first projection 48 are not necessarily so configured.

For example, the first projection 48 may be formed as a rib instead.

The first engaging member 30 is disposed on one of the first component 26 and the second component 28. Here, the first engaging member 30 is disposed on the first component 26 by way of example. The first engaging member 30 is configured to engage with the other of the first component 26 and the second component 28. Here, the first engaging member 30 is configured to engage with the second component 28 by way of example. Preferably, the first engaging member 30 includes a first fixing portion 30a, a first elastic arm 30b, and a first engaging portion 30c. The first fixing portion 30a is connected to the first component 26. The first elastic arm 30b extends from the first fixing portion 30a. The first engaging portion 30c is disposed on the first elastic arm 30b and is, for example, a protruding block (or hook) for engaging with any one of a plurality of different portions of the second component 28. For example, the first engaging portion 30c is configured to engage with a first feature 28a or a second feature 28b of the second component 28, wherein the first feature 28a and the second feature 28b are preferably holes or grooves.

The first coupling member 32 is disposed on the second component 28. In this embodiment, the first coupling member 32 is pivotally connected with respect to the second component 28. For example, the first coupling member 32 is pivotally connected to the second component 28 at a position adjacent to an end portion of the second component 28 via a second pivotal connection element 50. In practice, however, the first coupling member 32 is not necessarily so connected.

Preferably, the cable management device 20 further includes a third component 52, a fourth component 54, and a second engaging member 56. Preferably, the cable management device 20 further includes a second coupling member 58.

The third component 52 is pivotally connected with respect to the second cable management arm 24, wherein the pivotal connection may be formed either directly or indirectly. Here, the third component 52 is pivotally connected to the second cable management arm 24 at a position adjacent to the first end portion 24a of the second cable management arm 24 via a third pivotal connection element 60 by way of example but not limitation.

The fourth component 54 can be displaced with respect to the third component 52. Preferably, the fourth component 54 and the third component 52 are movably mounted with respect to each other through a channel 62. Here, by way of example, the fourth component 54 includes a first wall 64a, a second wall 64b, and a middle wall 66 connected between the first wall 64a and the second wall 64b; and the first wall 64a, the second wall 64b, and the middle wall 66 of the fourth component 54 jointly define the channel 62 for accommodating the third component 52. Preferably, the third component 52 includes a second guiding feature 68, and the fourth component 54 is additionally equipped, or integrally formed, with a second projection 70. The second projection 70 is located in a portion of the second guiding feature 68 so that the fourth component 54 can be displaced with respect to the third component 52 to a limited extent. In this embodiment, the second guiding feature 68 is a slot or elongated groove with a boundary, and the second projection 70 has a body 70a and a head 70b. The body 70a extends through a portion of the second guiding feature 68 and is connected to the fourth component 54. The head 70b is larger than the body 70a and is stopped on one side of the third component 52. In practice, however, the second guiding feature 68 and the second projection 70 are not necessarily so configured. For example, the second projection 70 may be formed as a rib instead.

The second engaging member 56 is disposed on one of the third component 52 and the fourth component 54. Here, the second engaging member 56 is arranged on the third component 52 by way of example. The second engaging member 56 is configured to engage with the other of the third component 52 and the fourth component 54. Here, the second engaging member 56 is configured to engage with the fourth component 54 by way of example. Preferably, the second engaging member 56 includes a second fixing portion 56a, a second elastic arm 56b, and a second engaging portion 56c. The second fixing portion 56a is connected to the third component 52. The second elastic arm 56b extends from the second fixing portion 56a. The second engaging portion 56c is disposed on the second elastic arm 56b and is, for example, a protruding block (or hook) for engaging with any one of a plurality of different portions of the fourth component 54. For example, the second engaging portion 56c is configured to engage with a first feature 54a or a second feature 54b of the fourth component 54, wherein the first feature 54a and the second feature 54b are preferably holes or grooves.

The second coupling member 58 is disposed on the fourth component 54. In this embodiment, the second coupling member 58 is pivotally connected with respect to the fourth component 54. For example, the second coupling member 58 is pivotally connected to the fourth component 54 at a position adjacent to an end portion of the fourth component 54 via a fourth pivotal connection element 72. In practice, however, the second coupling member 58 is not necessarily so connected.

Preferably, the cable management device 20 further includes a supporting member 74, a mounting base 76, and a third coupling member 78.

The supporting member 74 has a predetermined length and is movably disposed below the first cable management arm 22 and the second cable management arm 24 in order to support one of the first cable management arm 22 and the second cable management arm 24. Here, the supporting member 74 is connected to a bottom portion of the pivotal connection base 34 by way of example. The mounting base 76 is pivotally connected to a supporting base 75 via a mounting member 81, wherein the supporting base 75 is connected to the supporting member 74. The third coupling member 78 can be displaced with respect to the mounting base 76. Preferably, the mounting base 76 includes at least one third guiding feature 80, and the third coupling member 78 is additionally equipped, or integrally formed, with at least one third projection 82. The at least one third projection 82 is located in a portion of the at least one third guiding feature 80 so that the third coupling member 78 can be displaced with respect to the mounting base 76 to a limited extent. In this embodiment, the at least one third guiding feature 80 is a slot or elongated groove with a boundary, and the at least one third projection 82 has a body 82a and a head 82b. The body 82a extends through a portion of the at least one third guiding feature 80 and is connected to the third coupling member 78. The head 82b is larger than the body 82a and is stopped on one side of the mounting base 76. In practice, however, the at least one third guiding feature 80 and the at least one third projection 82 are not necessarily so configured. For example, the at least one third projection 82 may be formed as a rib instead.

Preferably, the cable management device 20 further includes a third engaging member 84. The third engaging member 84 is disposed on one of the mounting base 76 and the third coupling member 78. Here, the third engaging member 84 is disposed on the mounting base 76 by way of example. The third engaging member 84 is configured to engage with the other of the mounting base 76 and the third coupling member 78. Here, the third engaging member 84 is configured to engage with the third coupling member 78 by way of example. Preferably, the third engaging member 84 includes a third fixing portion 84*a*, a third elastic arm 84*b*, and a third engaging portion 84*c*. The third fixing portion 84*a* is connected to the mounting base 76. The third elastic arm 84*b* extends from the third fixing portion 84*a*. The third engaging portion 84*c* is disposed on the third elastic arm 84*b* and is, for example, a protruding block (or hook) for engaging with any one of a plurality of different portions of the third coupling member 78. For example, the third engaging portion 84*c* is configured to engage with at least one first feature 78*a* or at least one second feature 78*b* of the third coupling member 78, wherein the at least one first feature 78*a* and the at least one second feature 78*b* are preferably holes or grooves. It is worth mentioning that the mounting base 76, the first component 26, and the third component 52 are all pivotable and can be pointed in the same direction.

As shown in FIG. 2, the second component 28 (together with the first coupling member 32) can arrive at a corresponding first position P1 with respect to the first component 26 (see also FIG. 3), the fourth component 54 (together with the second coupling member 58) can arrive at a corresponding first position P1 with respect to the third component 52, and the third coupling member 78 can arrive at a corresponding first position P1 with respect to the mounting base 76.

Figure 4:
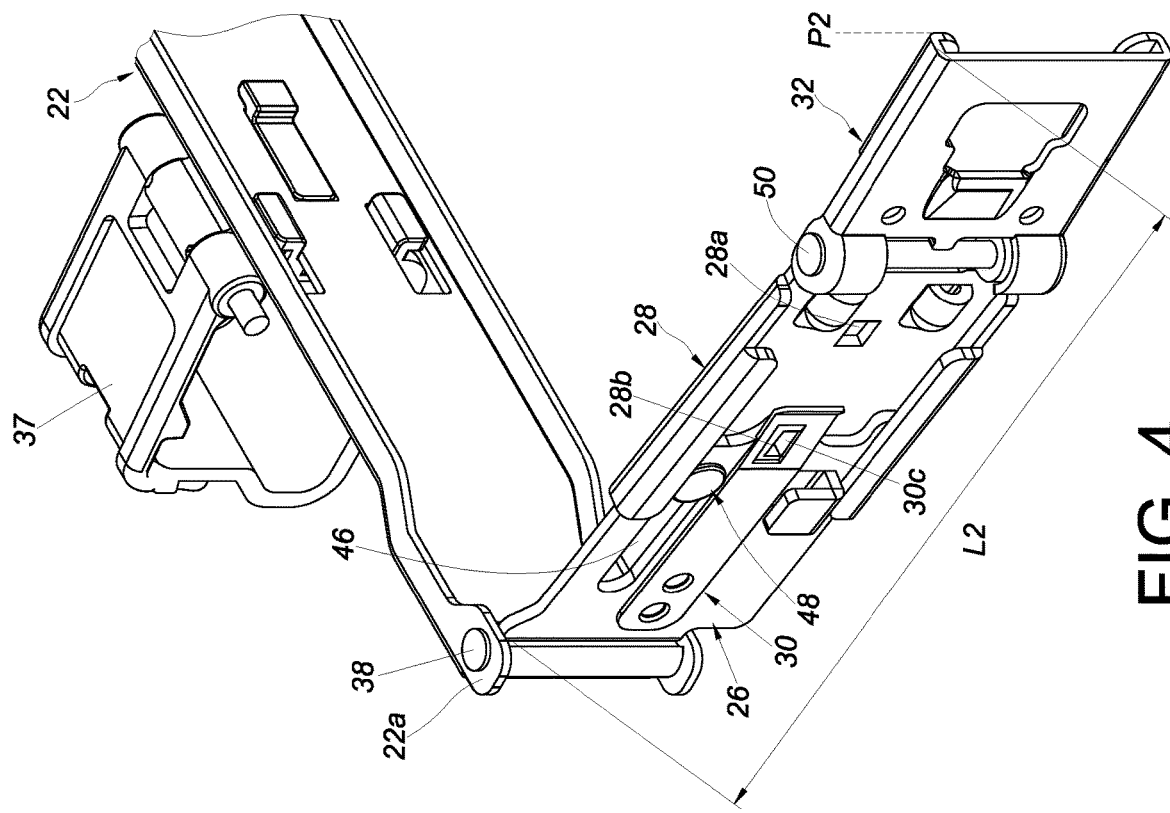
FIG. 4 is a schematic perspective view showing that the first component of the cable management device according to the embodiment of the present invention can be displaced to and kept at a second position with respect to the second mentioned component.
Figure 3:
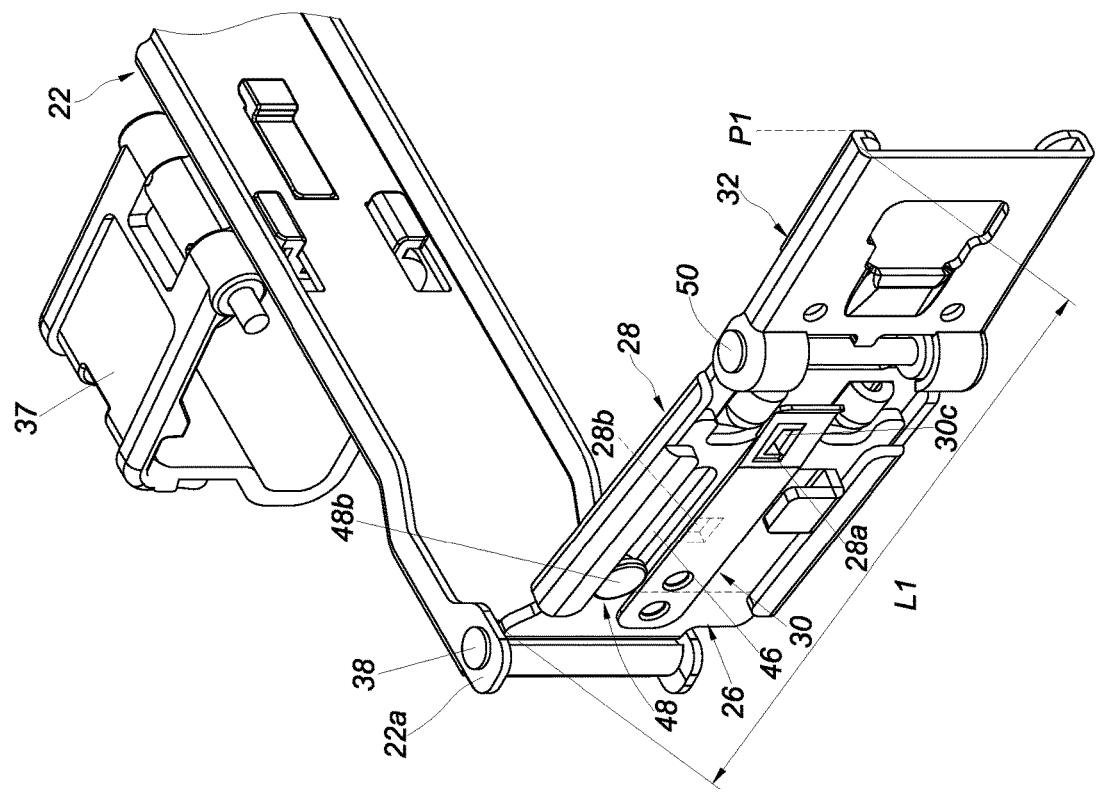
FIG. 3 is a schematic perspective view showing that a component of the cable management device according to the embodiment of the present invention can be displaced to and kept at a first position with respect to another component.

As shown in FIG. 3 and FIG. 4, the second component 28 (together with the first coupling member 32) can be displaced with respect to the first component 26 from the corresponding first position P1 to a corresponding second position P2 Similarly, the fourth component 54 (together with the second coupling member 58) can be displaced with respect to the third component 52 from the corresponding first position P1 in FIG. 2 to a corresponding second position (not shown).

Please note that the first engaging member 30 can engage with the second component 28 to keep the second component 28 (and the first coupling member 32) at one of a plurality of different positions with respect to the first component 26. For example, when the second component 28 (and the first coupling member 32) are at the corresponding first position P1 with respect to the first component 26, the first engaging portion 30*c* of the first engaging member 30 can be brought into engagement with the first feature 28*a* of the second component 28 to keep the second component 28 at the corresponding first position P1 as shown in FIG. 3, and when the second component 28 (and the first coupling member 32) are at the corresponding second position P2 with respect to the first component 26, the first engaging portion 30*c* of the first engaging member 30 can be brought into engagement with the second feature 28*b* of the second component 28 to keep the second component 28 at the corresponding second position P2 as shown in FIG. 4.

It is worth mentioning that, when the second component 28 is at the corresponding first position P1 with respect to the first component 26, the second component 28 and the first component 26 define a first length L1 (see FIG. 3). Here, with the first coupling member 32 disposed on the second component 28, the first length L1 is shown as extending between the front end of the first coupling member 32 and the rear end of the first component 26 by way of example Similarly, when the second component 28 is at the corresponding second position P2 with respect to the first component 26, the second component 28 and the first component 26 define a second length L2 (see FIG. 4), wherein the second length L2 is different from the first length L1. Here, with the first coupling member 32 disposed on the second component 28, the second length L2 is shown as extending between the front end of the first coupling member 32 and the rear end of the first component 26 by way of example, and the second length L2 is greater than the first length L1.

Likewise, as shown in FIG. 2 and FIG. 1, the second engaging portion 56*c* of the second engaging member 56 can be brought into engagement with the first feature 54*a* or the second feature 54*b* of the fourth component 54 to keep the fourth component 54 (and the second coupling member 58) at the corresponding first position P1 or the corresponding second position, and the fourth component 54 and the third component 52 define different lengths when the fourth component 54 arrives respectively at the corresponding second position from the corresponding first position P1 with respect to the third component 52 and at the corresponding first position P1 from the corresponding second position.

Figure 5:
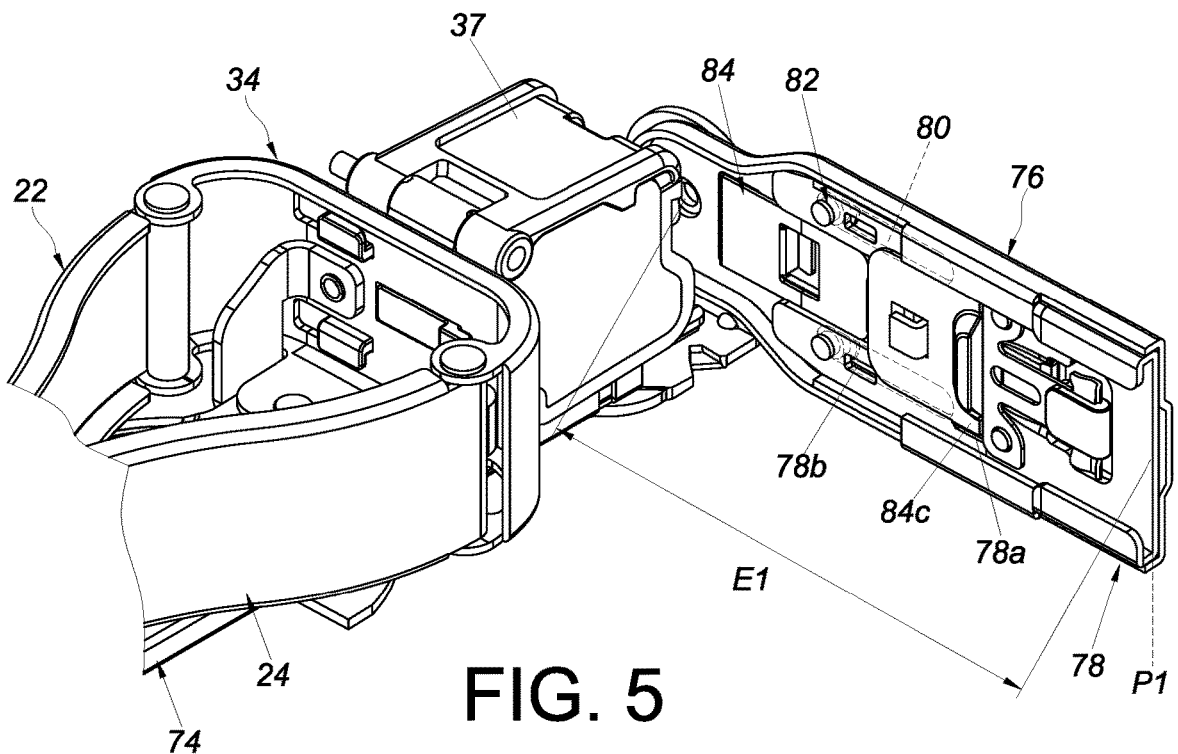
FIG. 5 is a schematic perspective view showing that a coupling member of the cable management device according to the embodiment of the present invention can be displaced to and kept at a first position with respect to a mounting base.
Figure 6:
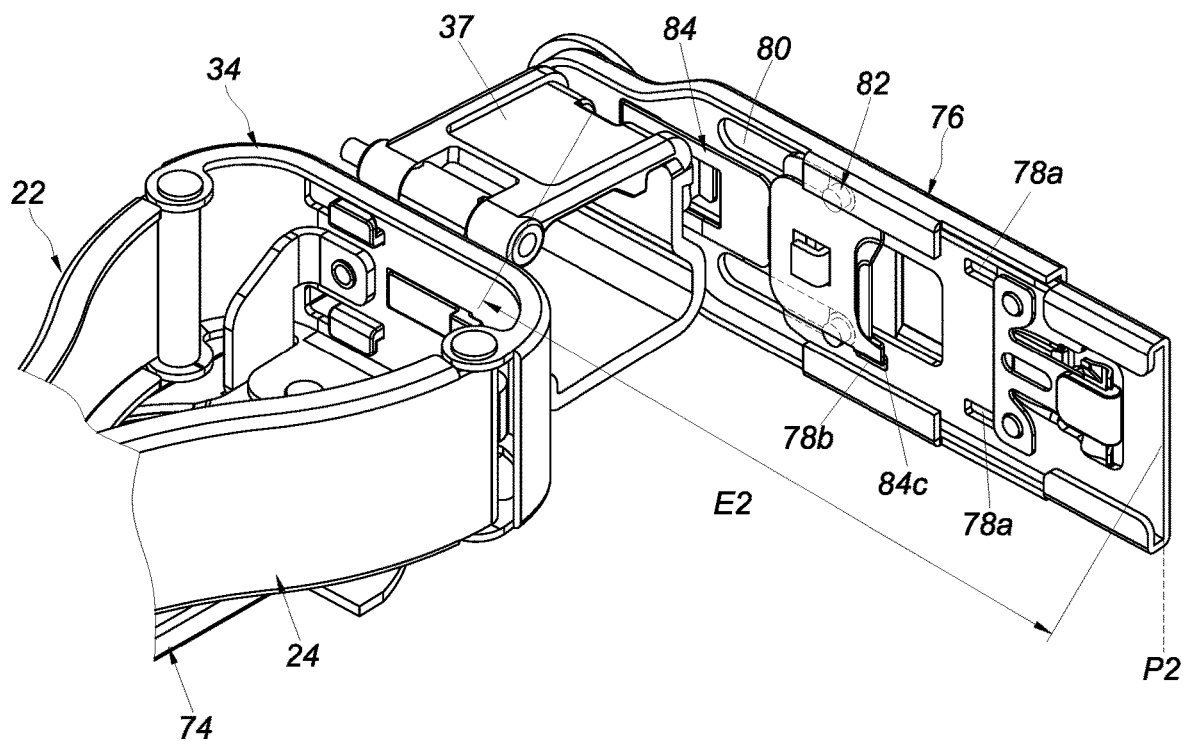
FIG. 6 is a schematic perspective view showing that the coupling member of the cable management device according to the embodiment of the present invention can be displaced to and kept at a second position with respect to the mounting base.

Referring to FIG. 5 and FIG. 6 in conjunction with FIG. 2, the third coupling member 78 can be displaced with respect to the mounting base 76 from the corresponding first position P1 to a corresponding second position P2. When the third coupling member 78 is at the corresponding first position P1, the third engaging portion 84*c* of the third engaging member 84 can be brought into engagement with the at least one first feature 78*a* of the third coupling member 78 to keep the third coupling member 78 at the corresponding first position P1, thereby defining a first length E1 between the front end of the third coupling member 78 and the rear end of the mounting base 76. When the third coupling member 78 is at the corresponding second position P2, the third engaging portion 84*c* of the third engaging member 84 can be brought into engagement with the at least one second feature 78*b* of the third coupling member 78 to keep the third coupling member 78 at the corresponding second position P2, thereby defining a second length E2 between the front end of the third coupling member 78 and the rear end of the mounting base 76, wherein the second length E2 is different from the first length E1. Here, the second length E2 is greater than the first length E1.

Figure 7:
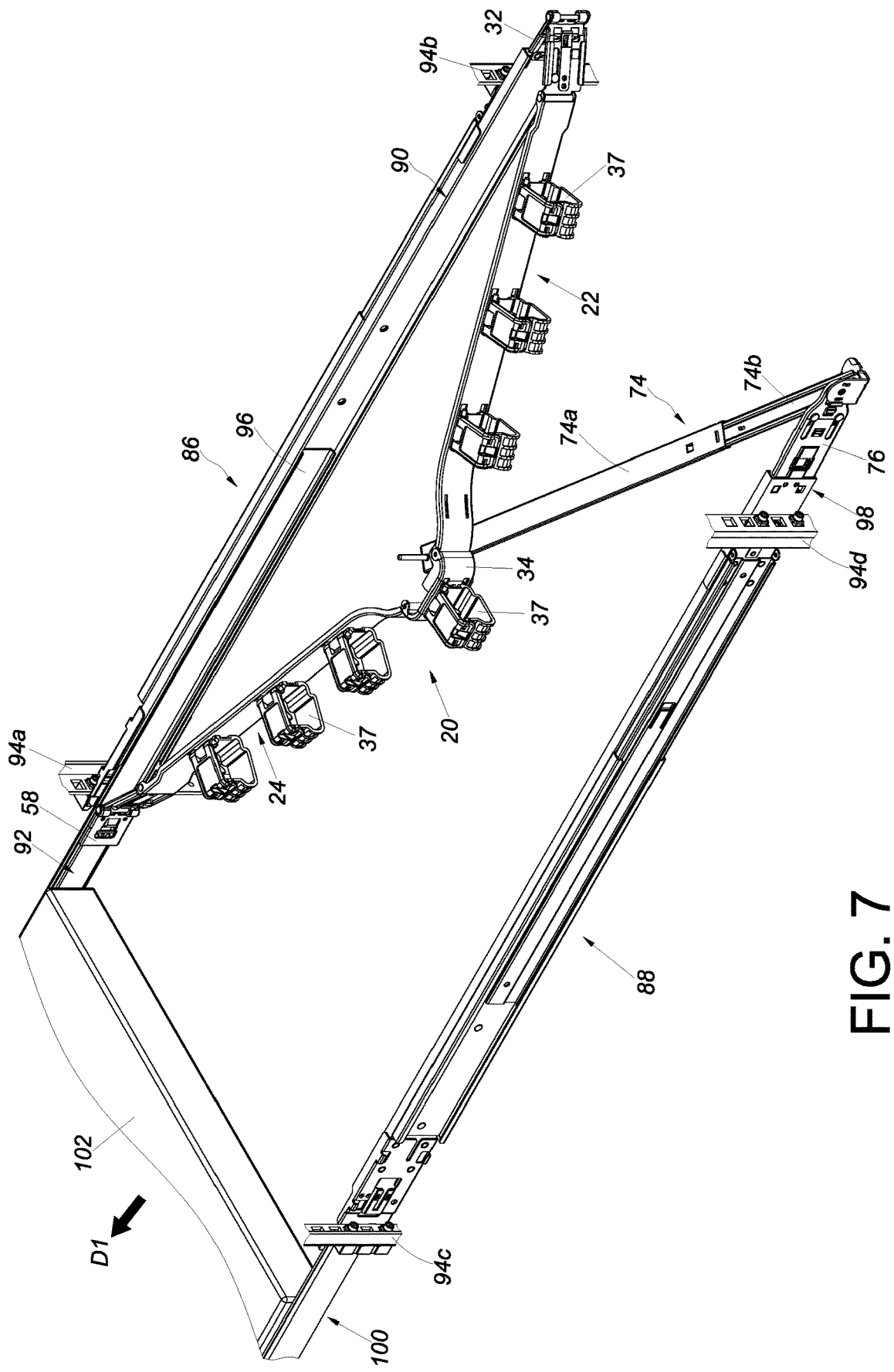
FIG. 7 is a schematic perspective view showing that a piece of electronic equipment is pulled out of a rack through the slide rails of a pair of slide rail assemblies to which the cable management device according to the embodiment of the present invention is coupled.

FIG. 7 shows a rack system that includes the cable management device 20, a first slide rail assembly 86 (referred to as a slide rail assembly in the claims), and a second slide rail assembly 88 (referred to as another slide rail assembly in the claims). The cable management device 20 and the first slide rail assembly 86 constitute a coupling assembly. The first slide rail assembly 86 includes a first rail 90 and a second rail 92 longitudinally displaceable with respect to the first rail 90. The first rail 90 is, for example, fixed on a first post 94*a* and a second post 94*b* of a rack, and the second rail 92 can be displaced with respect to the first rail 90. Preferably, the first slide rail assembly 86 further includes a middle rail 96 movably mounted between the first rail 90 and the second rail 92 to increase the distance for which the second rail 92 can be displaced with respect to the first rail 90 Similarly, the second slide rail assembly 88 includes a third rail 98 and a fourth rail 100; the third rail 98 is, for example, fixed on another first post 94*c* and another second post 94*d* of the rack; and the fourth rail 100 can be displaced with respect to the third rail 98.

The first cable management arm 22 of the cable management device 20 is coupled to a first target object through the first coupling member 32. Here, the first target object is the first rail 90 of the first slide rail assembly 86, such as but not limited to a rear end portion of the first rail 90. The first target object may alternatively be the second post 94b, a bracket, or other objects where the first cable management arm 22 can be mounted. The second cable management arm 24 is coupled to a second target object such as the second rail 92 of the first slide rail assembly 86. Here, the second cable management arm 24 is coupled to the second rail 92 of the first slide rail assembly 86 (such as but not limited to a rear end portion of the second rail 92) through the second coupling member 58. The second target object may alternatively be a piece of electronic equipment (as described further below), a chassis (as described further below), or other movable objects. In addition, the supporting member 74 includes a first supporting portion 74a and a second supporting portion 74b that are retractable/extensible with respect to each other. As shown in FIG. 7 (see also FIG. 2), the third coupling member 78 is coupled to a third target object such as the third rail 98 of the second slide rail assembly 88.

Here, the third coupling member 78 is coupled to a rear end portion of the third rail 98, but in practice the third coupling member 78 may alternatively be coupled to the second post 94d, a bracket, or other objects where the third coupling member 78 can be mounted.

A piece of electronic equipment 102 (or a chassis) is mounted between the first slide rail assembly 86 and the second slide rail assembly 88. The electronic equipment 102 can be pulled in a first direction D1 from inside the rack to outside the rack via the second rail 92 and the fourth rail 100 and thus be displaced out of the rack. During the process, the second cable management arm 24 is opened with respect to the first cable management arm 22 in response to the second rail 92 of the first slide rail assembly 86 (or the electronic equipment 102) being displaced in the first direction D1. The cable accommodating features 37 can be used to receive the cables trailing behind the electronic equipment 102. (A person of ordinary skill in the art should be able to understand how cables are received in the cable accommodating features 37, so further description is omitted for the sake of brevity.) Also, the supporting member 74 can support the first cable management arm 22 or the second cable management arm 24.

Figure 8:
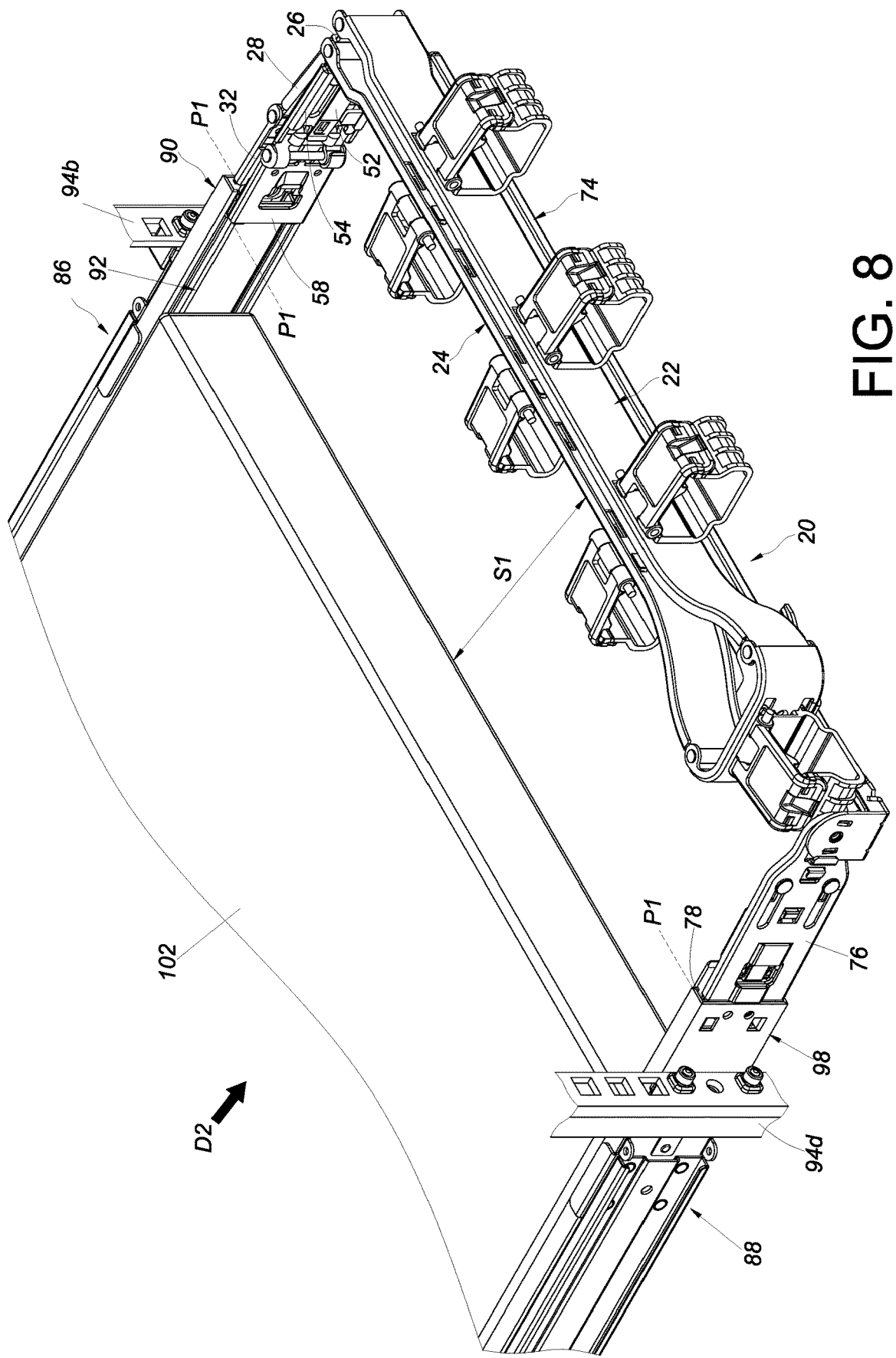
FIG. 8 is a schematic perspective view showing that the electronic equipment is pushed back in the rack through the slide rails of the slide rail assemblies, with the cable management device in a first state.

As shown in FIG. 8, the electronic equipment 102 can be pushed in a second direction D2 from outside the rack to inside the rack. During the process, the second cable management arm 24 is brought close to (or closed with respect to) the first cable management arm 22 in response to the second rail 92 of the first slide rail assembly 86 (or the electronic equipment 102) being displaced in the second direction D2, with the supporting member 74 supporting the first cable management arm 22 or the second cable management arm 24.

More specifically, the first cable management arm 22 in FIG. 8 is in a closed state with respect to the second cable management arm 24. When the second component 28 (and the first coupling member 32) are at the corresponding first position P1 with respect to the first component 26, the fourth component 54 (and the second coupling member 58) are at the corresponding first position P1 with respect to the third component 52, and/or the third coupling member 78 is at the corresponding first position P1 with respect to the mounting base 76, a first space S1 is defined between the rear side of the electronic equipment 102 and (the second cable management arm 24 of) the cable management device 20. The first space S1, however, may not be large enough for the cables trailing behind the electronic equipment 102 or may be too narrow for a technician to arrange the cables with ease.

Figure 9:
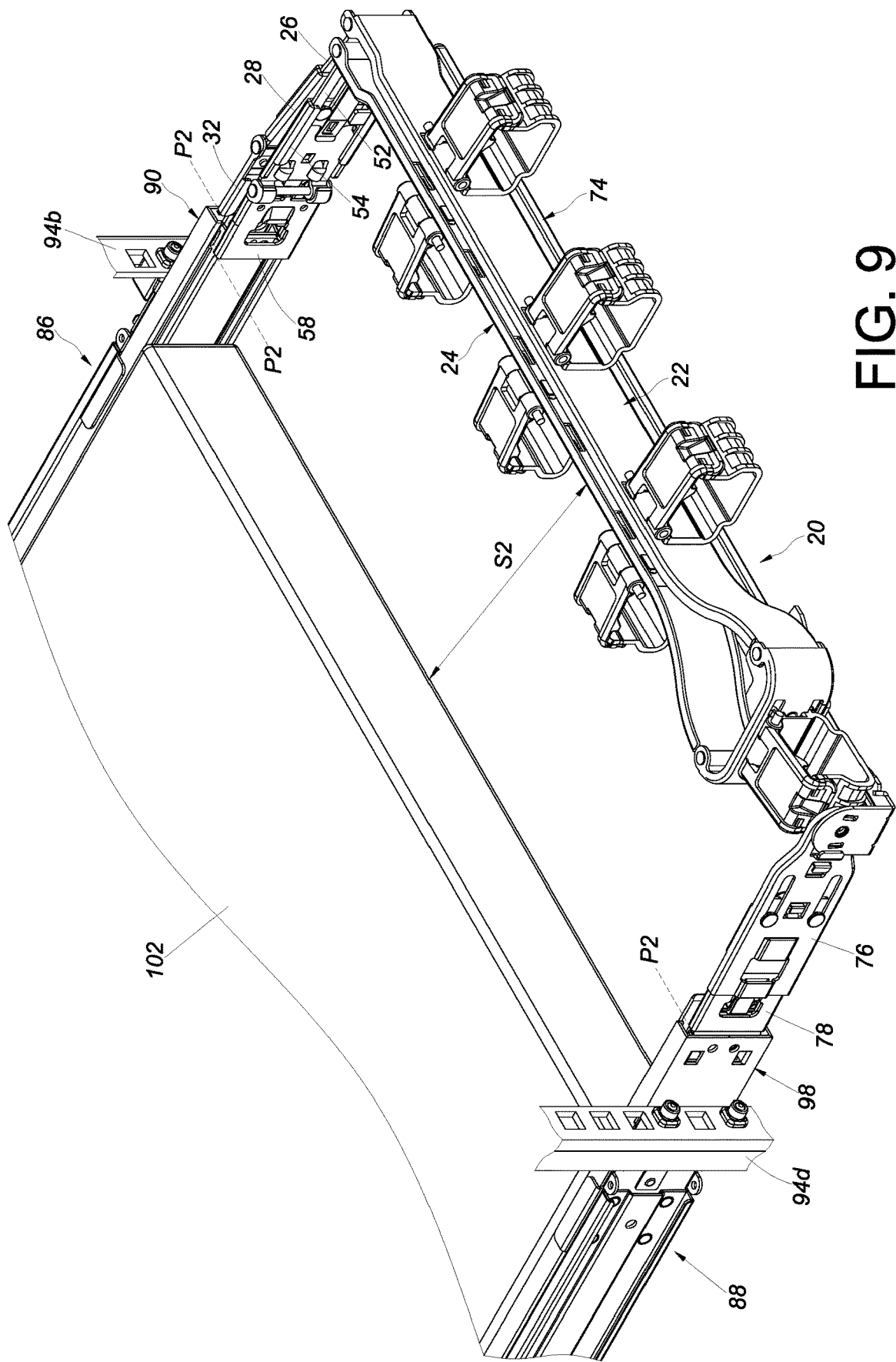
FIG. 9 is a schematic perspective view showing that the electronic equipment is pushed back in the rack through the slide rails of the slide rail assemblies, with the cable management device in a second state.

FIG. 9 shows the first cable management arm 22 in the closed state with respect to the second cable management arm 24 too, but a second space S2 larger than the first space Si is defined between the rear side of the electronic equipment 102 and (the second cable management arm 24 of) the cable management device 20 by increasing the coupling length of the cable management device 20 (i.e., the coupling length between the cable management device 20 and the slide rail assemblies 86, 88), or more specifically by displacing the second component 28 (and the first coupling member 32) to the corresponding second position P2 with respect to the first component 26, the fourth component 54 (and the second coupling member 58) to the corresponding second position P2 with respect to the third component 52, and/or the third coupling member 78 to the corresponding second position P2 with respect to the mounting base 76. The second space S2 provides more room for, and thus makes it easier to work with, the cables trailing behind the electronic equipment 102. For example, the second space S2 allows a technician to arrange the cables with greater ease.

The coupling assembly described above and its cable management device preferably have the following features:

1. The cable management device 20 has a mechanism (or more particularly a retractable mechanism) that allows the second component 28 (and the first coupling member 32) to be shifted in position with respect to the first component 26, the fourth component 54 (and the second coupling member 58) to be shifted in position with respect to the third component 52, and/or the third coupling member 78 to be shifted in position with respect to the mounting base 76, thereby changing the coupling length of the cable management device 20 to solve space-related problems.
2. The first engaging member 30 can be used to keep the second component 28 (and the first coupling member 32) in position with respect to the first component 26; the second engaging member 56 can be used to keep the fourth component 54 (and the second coupling member 58) in position with respect to the third component 52; and the third engaging member 84 can be used to keep the third coupling member 78 in position with respect to the mounting base 76.
3. The foregoing adjustable design enables the present invention to adapt to chassis of different sizes, e.g., of different depths.

While the present invention has been disclosed through the preferred embodiment described above, the embodiment is not intended to be restrictive of the scope of the invention. The scope of patent protection sought by the applicant is defined by the appended claims.

What is claimed is:

1. A coupling assembly, comprising:
   a slide rail assembly including a first rail and a second rail, wherein the second rail is displaceable with respect to the first rail; and
   a cable management device coupled to the slide rail assembly and including:
      a first cable management arm;
      a second cable management arm pivotally connected with respect to the first cable management arm;
      a first component pivotally connected with respect to the first cable management arm;
      a second component displaceable with respect to the first component;

a third component pivotally connected with respect to the second cable management arm;
a fourth component displaceable with respect to the third component;
a first engaging member disposed on one of the first component and the second component, wherein the first engaging member is configured to engage with the other of the first component and the second component and thereby hold the second component alternatively at one of a first position and a second position with respect to the first component; and
a second engaging member disposed on one of the third component and the fourth component, wherein the second engaging member is configured to engage with the other of the third component and the fourth component and thereby hold the fourth component alternatively at one of a plurality of different positions with respect to the third component.

2. The coupling assembly of claim 1, wherein the first component includes a first guiding feature, the second component is provided with a first projection, and the first projection is located in a portion of the first guiding feature in order for the second component to be displaceable with respect to the first component.

3. The coupling assembly of claim 2, wherein the first guiding feature is a slot or an elongated groove.

4. The coupling assembly of claim 1, wherein one of the first component and the second component defines a channel, and the first component and the second component are moveably mounted with respect to each other via the channel.

5. The coupling assembly of claim 1, wherein:
the first engaging member is arranged on the first component,
the first engaging member includes a first elastic arm and a first engaging portion disposed on the first elastic arm, and
the first engaging portion is configured to engage with one of a first feature and a second feature of the second component to thereby hold the second component respectively at the first position and at the second position.

6. The coupling assembly of claim 1, wherein the cable management device further includes a first coupling member pivotally connected with respect to the second component, and the first coupling member is configured to mount the cable management device on the first rail, the second component being thereby enabled to pivot with respect to the first rail.

7. The coupling assembly of claim 1, wherein:
the third component includes a second guiding feature,
the fourth component is provided with a second projection, and
the second projection is located in a portion of the second guiding feature in order to limit the displacement of the fourth component with respect to the third component.

8. The coupling assembly of claim 7, wherein the second guiding feature is a slot or an elongated groove.

9. The coupling assembly of claim 1, wherein one of the third component and the fourth component defines a channel, and the third component and the fourth component are moveably mounted with respect to each other via a channel.

10. The coupling assembly of claim 1, wherein:
the second engaging member is disposed on the third component,
the second engaging member includes a second elastic arm and a second engaging portion disposed on the second elastic arm, and
the second engaging portion is configured to engage alternatively with one of a first feature and a second feature of the fourth component to thereby hold the fourth component respectively at two of the plurality of different positions.

11. The coupling assembly of claim 1, wherein the cable management device further includes a second coupling member pivotally connected with respect to the fourth component, and the second coupling member is configured to mount the cable management device on the second rail, the fourth component being thereby enabled to pivot with respect to the second rail.

12. The coupling assembly of claim 1, wherein:
the cable management device further includes a supporting member, a mounting base, and a third coupling member;
the supporting member is configured to support one of the first cable management arm and the second cable management arm;
the mounting base is disposed on a supporting base connected to the supporting member; and
the third coupling member is displaceable with respect to the mounting base.

13. The coupling assembly of claim 12, wherein:
the mounting base includes a third guiding feature,
the third coupling member is provided with a third projection, and
the third projection is located in a portion of the third guiding feature in order to limit the displacement of the third coupling member with respect to the mounting base.

14. The coupling assembly of claim 12, further comprising another slide rail assembly including a third rail and a fourth rail, wherein the fourth rail is displaceable with respect to the third rail, and the third coupling member is configured to be coupled to the third rail.

15. A cable management device, comprising:
a first cable management arm;
a second cable management arm movable with respect to the first cable management arm;
a first component pivotally connected with respect to the first cable management arm;
a second component movably mounted to the first component to be limited in displacement with respect to the first component between a first position and a second position, the second component locked against dismounting from the first component;
a third component pivotally connected with respect to the second cable management arm; and
a fourth component displaceable with respect to the third component;
wherein when the second component is at the first position with respect to the first component, the second component and the first component define a first length;
wherein when the second component moves from the first position to the second position with respect to the first component, the second component and the first component collectively extend to define a second length greater than the first length;
wherein the fourth component and the third component define different lengths when the fourth component reaches different positions after displacement with respect to the third component.

16. The cable management device of claim 15, further comprising:
- a first engaging member disposed on one of the first component and the second component, wherein the first engaging member is configured to engage with the other of the first component and the second component and thereby hold the second component alternatively at one of the first position and the second position with respect to the first component; and
- a first coupling member disposed on the second component and configured to mount the cable management device on a first target object.

17. The cable management device of claim 15, further comprising:
- a second engaging member disposed on one of the third component and the fourth component, and configured to engage with the other of the third component and the fourth component and thereby hold the fourth component alternatively at one of a plurality of different positions with respect to the third component; and
- a second coupling member disposed on the fourth component, and configured to mount the cable management device on a second target object.

18. The cable management device of claim 15, further comprising a supporting member, a mounting base, and a third coupling member,
- wherein the supporting member is configured to support one of the first cable management arm and the second cable management arm,
- the mounting base is pivotally connected with respect to the supporting member,
- the third coupling member is displaceable with respect to the mounting base, and
- the third coupling member is configured to mount the cable management device on a third target object.

* * * * *